(12) United States Patent
Zhang et al.

(10) Patent No.: US 11,783,961 B2
(45) Date of Patent: Oct. 10, 2023

(54) CONDUCTIVE FILM AND ELECTRONIC DEVICE

(71) Applicant: SHINE OPTOELECTRONICS (KUNSHAN) CO., LTD., Kunshan (CN)

(72) Inventors: Sheng Zhang, Kunshan (CN); Fei Zhou, Kunshan (CN)

(73) Assignee: SHINE OPTOELECTRONICS (KUNSHAN) CO., LTD., Kunshan (CN)

( * ) Notice: Subject to any disclaimer, the term of this patent is extended or adjusted under 35 U.S.C. 154(b) by 76 days.

(21) Appl. No.: 17/497,951

(22) Filed: Oct. 10, 2021

(65) Prior Publication Data

US 2022/0028575 A1 Jan. 27, 2022

Related U.S. Application Data

(63) Continuation of application No. PCT/CN2020/080121, filed on Mar. 19, 2020.

(30) Foreign Application Priority Data

Apr. 19, 2019 (CN) .......................... 201910315650.8

(51) Int. Cl.
*H05K 9/00* (2006.01)
*H01B 5/14* (2006.01)

(52) U.S. Cl.
CPC ............. *H01B 5/14* (2013.01); *H05K 9/0086* (2013.01); *H05K 9/0094* (2013.01)

(58) Field of Classification Search
CPC .......................... H05K 9/0094; H05K 9/0086
See application file for complete search history.

(56) References Cited

U.S. PATENT DOCUMENTS

| | | | |
|---|---|---|---|
| 2011/0298670 A1 | 12/2011 | Jung et al. | |
| 2014/0158417 A1* | 6/2014 | Zmek | H05K 9/0094 |
| | | | 427/256 |

(Continued)

FOREIGN PATENT DOCUMENTS

| | | |
|---|---|---|
| CN | 2569536 Y | 8/2003 |
| CN | 103763899 A | 4/2014 |

(Continued)

OTHER PUBLICATIONS

First Office Action issued in counterpart Chinese Patent Application No. 201910315650.8, dated Feb. 22, 2021.

(Continued)

*Primary Examiner* — Hung V Ngo
(74) *Attorney, Agent, or Firm* — Westbridge IP LLC

(57) ABSTRACT

A conductive film includes a transparent supporting layer and a conductive grid. The transparent supporting layer includes a first side face and a second side face arranged opposite to each other, and the first side face is provided with grooves. A conductive material is filled in the grooves to form the conductive grid interconnected, and the conductive grid includes a plurality of circle lattices. Since the conductive material is filled in the grooves to form the conductive grid and the conductive grid includes a plurality of circle lattices, the dot pattern presented is relatively soft, and the impact on vision caused by interference is reduced.

16 Claims, 3 Drawing Sheets

(56) References Cited

U.S. PATENT DOCUMENTS

2014/0216804 A1* 8/2014 Yang .................... H05K 9/0096
174/268
2017/0055380 A1* 2/2017 Lu ........................ H05K 9/0086

FOREIGN PATENT DOCUMENTS

| CN | 203760096 U | 8/2014 |
| --- | --- | --- |
| CN | 107369491 A | 11/2017 |
| CN | 108509101 A | 9/2018 |
| CN | 207833940 U | 9/2018 |
| CN | 207955054 U | 10/2018 |
| CN | 108762569 A | 11/2018 |
| CN | 108874251 A | 11/2018 |
| CN | 209607431 U | 11/2019 |
| JP | 2002111278 A | 4/2002 |

OTHER PUBLICATIONS

International Search Report issued in corresponding PCT Application No. PCT/CN2020/080121, dated May 26, 2020.
Qi et al., Progress on Metal Mesh Transparent Conductive Coatings and Its Applications, Materials Review, vol. 29, No. 9, pp. 31-35, dated Sep. 10, 2015.
Second Office Action issued in counterpart Chinese Patent Application No. 201910315650.8, dated Jul. 19, 2021.

* cited by examiner

CONDUCTIVE FILM AND ELECTRONIC DEVICE

CROSS-REFERENCE TO RELATED APPLICATIONS

This application is a continuation of International Application No. PCT/CN2020/080121, filed on Mar. 19, 2020, which claims priority to Chinese Patent Application No. 201910315650.8, filed on Apr. 19, 2019. The disclosures of the aforementioned applications are hereby incorporated by reference in their entireties.

TECHNICAL FIELD

The present disclosure relates to the electronic technology, and in particular to a conductive film and an electronic device.

BACKGROUND

Recently, with the rapid development of information-based society, electronic devices associated with information have developed rapidly. A higher requirement for electromagnetic shielding of aerospace devices, advanced optical instruments, communication devices and medical diagnostic instruments is needed, which is mainly required to have a higher electromagnetic shielding capability and reduce an impact on vision as much as possible. At present, the electromagnetic shielding of electronic devices is mainly realized by a conductive film with a shielding function. However, a conductive grid used by the existing conductive film with the shielding function is seriously interfered with light, thereby affecting a clarity of vision.

In view of this, the existing technical problem has been solved in the present disclosure by improving a conductive film.

SUMMARY

On this basis, it is necessary to provide a conductive film to solve the above technical problem.

A technical solution of the present disclosure is described below.

A conductive film is provided, including:

a transparent supporting layer, including a first side face and a second side face arranged opposite to each other, wherein the first side face is provided with grooves, and the grooves form a grid shape; and a conductive grid, wherein a conductive material is filled in the grooves to form the conductive grid interconnected; and the conductive grid includes a plurality of circle lattices.

In one embodiment, the circle lattice includes a circular lattice, a quasi-circular lattice or an elliptic lattice.

In one embodiment, the conductive grid includes a plurality of circular lattices and the plurality of circular lattices are connected in a circumscribed form in the grooves.

In one embodiment, some of the plurality of circular lattices are connected through a linear grid line.

In one embodiment, there is one or more diameter dimensions of the plurality of circular lattices.

In one embodiment, the conductive grid includes a plurality of circular lattices, centers of the circular lattices are distributed according to a honeycomb grid, and the plurality of circular lattices are connected in a circumscribed form and/or connected through a linear grid line.

In one embodiment, the conductive grid includes a plurality of elliptic lattices arranged in an array, and the plurality of elliptic lattices are connected in a circumscribed form and/or connected through linear grid lines.

In one embodiment, the elliptic lattices in a same row are regularly spaced according to major axis sizes of the elliptic lattices, the elliptic lattices in the same row are connected in a circumscribed form, and the elliptic lattices in adjacent rows are connected through a linear grid line.

In one embodiment, centers of the plurality of circle lattices are distributed according to a predetermined rule.

In one embodiment, the centers of the plurality of circle lattices are distributed according to regular polygons arranged in an array.

In one embodiment, the centers of the plurality of circle lattices are distributed according to regular triangles, regular quadrangles or regular hexagons without intervals.

In one embodiment, the plurality of circular lattices are connected in a circumscribed form or connected through a linear grid line.

In one embodiment, the plurality of circle lattices are distributed in a coordinate with an X-axis and a Y-axis, and a difference between a sheet resistance of the conductive grid distributed along the X-axis and a sheet resistance of the conductive grid distributed along the Y-axis does not exceed 5%.

In one embodiment, a total length of the conductive grid distributed along the X-axis is equal to a total length of the conductive grid distributed along the Y-axis.

In one embodiment, there is no internal tangent, inner sleeving and overlap between the plurality of circle lattices.

In one embodiment, a shape of a cross-section of each groove is a rectangle or an inverted trapezoid.

In one embodiment, the conductive grid is embedded in the first side face through the grooves.

In one embodiment, the plurality of circle lattices are overlapped and connected, and an overlapping amount at each overlapped place is the same.

The present disclosure has the following beneficial effects. Since the conductive material is filled in the grooves to form the conductive grid, in which the conductive grid includes a plurality of circle lattices, the dot pattern presented is relatively soft, and the impact on vision caused by interference is reduced.

DETAILED DESCRIPTION OF THE EMBODIMENTS

Figure 1:
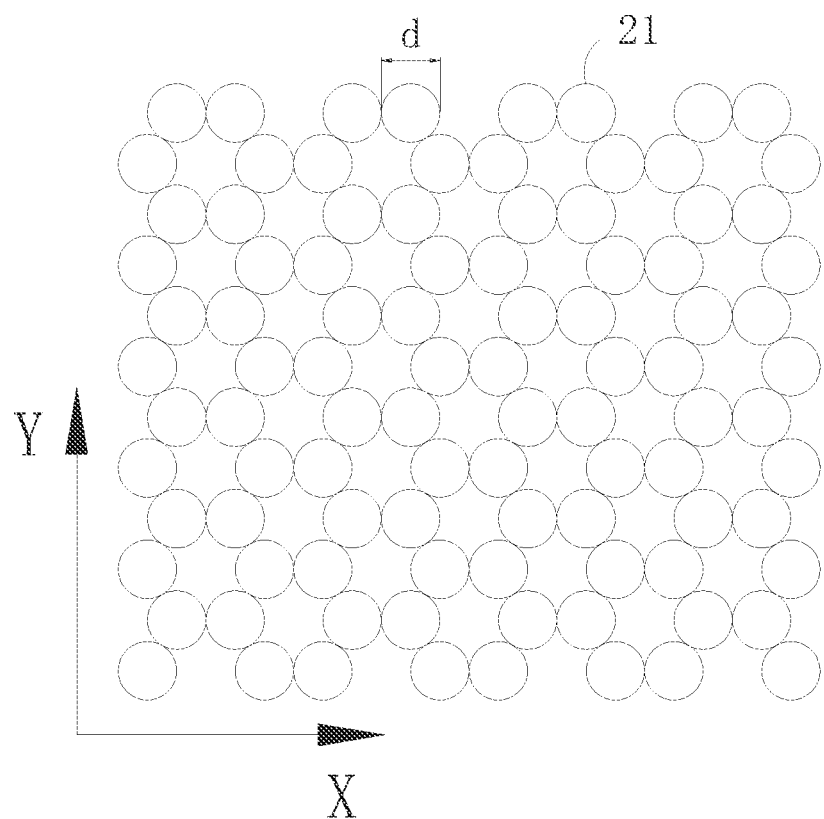
FIG. 1 is a plan view of a conductive film according to the present disclosure.

In order to facilitate the understanding of the present disclosure, the present disclosure will be described more completely below with reference to the relevant drawings. Preferred embodiments of the present disclosure are shown in the drawings. However, the present disclosure may be implemented in many different forms and is not limited to the embodiments described hereinafter. On the contrary, these embodiments are provided to make the present disclosure more thorough and comprehensive.

It should be noted that when an element is referred to as being "arranged on" another element, it may be arranged on the other element directly or there may be an intervening element therebetween. When an element is referred to as being "connected to" another element, it may be connected to the other element directly or there may be an intervening element therebetween. Terms such as "vertical", "horizontal", "left" and "right" used herein are only for the illustrative purpose and do not represent unique implementations.

Unless otherwise defined, all technical and scientific terms used herein have the same meaning as commonly understood by a person of ordinary skill in the art to which the present disclosure belongs. Here, the terms used in the description of the present disclosure are merely for describing specific implementations, rather than limiting the present disclosure. As used herein, the term "and/or" includes any or all combinations of one or more associated listed items.

The present disclosure discloses a conductive film, which includes a transparent supporting layer and a conductive grid. The transparent supporting layer includes a first side face and a second side face arranged opposite to each other. Grooves are formed on the first side face, and the grooves form a grid shape. A conductive material is filled in the grooves to form the conductive grid interconnected. The conductive grid includes a plurality of circle lattices. The dot pattern (i.e., speckled light and shadow formed by interference of the conductive grid with light) presented by the plurality of circle lattices is relatively soft and is with slight interference, so that the impact on vision caused by interference is reduced and the vision is clearer. Moreover, the conductive grid is formed by filling the grooves, so that shape of the conductive grid is realized by shape of the grooves, the electrical conductivity is better, the design is freer, and the connection is smoother.

The circle lattice may include a circular lattice, a quasi-circular lattice or an elliptic lattice. The quasi-circular lattice is defined as an approximately circular or elliptic lattice, in which a circumference is connected by curves or arcs and is without sharp point, however, it is different from the circular or elliptic shape.

In one embodiment, the conductive grid may include a plurality of circular lattices which are connected in a circumscribed form in the grooves. The plurality of circular lattices are all formed in the grooves and the grooves are interconnected with each other. The circular lattices are circumscribed to each other, and the tangent portions are located in the grooves, so as to achieve a seamless connection between the circular lattices, and the connection is natural and efficient. Moreover, it is unnecessary to additionally dispose a connecting component. In one embodiment, some circular lattices are connected through linear grid lines. In other words, the plurality of circular lattices are partly connected in a circumscribed form and partly connected through linear grid lines. The linear grid lines may include straight lines, curves, broken lines or the like.

There is one or more diameter dimensions of the plurality of circular lattices. In other words, circles of the circular lattices may be the same or different in size. For example, the circular lattices with big size and with small size are regularly spaced in the same row, or the circular lattices with big size and with small size are regularly spaced in the same column.

In another embodiment, the conductive grid may include a plurality of circular lattices, centers of the circular lattices are distributed according to a honeycomb grid, and the plurality of circular lattices are connected in a circumscribed form and/or connected through a linear grid line. For example, the plurality of circular lattices are the same in radius, and the centers are distributed according to a honeycomb grid. That is, the plurality of circular lattices are distributed according to regular hexagons without intervals, and adjacent circular lattices are connected in a circumscribed form. For another example, the plurality circular lattices are the same or different in radius, and the centers are distributed according to a honeycomb grid. Adjacent circular lattices are connected in a circumscribed form when they are the same in radius, while adjacent circular lattices are connected through a linear grid line (for example, through a linear grid line in the form of straight line) when they are different in radius. Of course, the linear grid lines are also arranged in the grooves to connect adjacent circular lattices in the grooves.

In another embodiment, the conductive grid may include a plurality of elliptic lattices arranged in an array, and the plurality of elliptic lattices are connected in a circumscribed form and/or connected through a linear grid line. For example, the elliptic lattices in a same row are regularly spaced according to major axis sizes of the elliptic lattices, the elliptic lattices in the same row are connected in a circumscribed form, and the elliptic lattices in adjacent rows are connected through linear grid lines.

Centers of the plurality of circle lattices are distributed according to a predetermined rule. The circle lattices may be circles or ellipses with regular peripheries, or may be quasi-circles with irregular peripheries. The shape arrangement of the conductive grid may be better controlled by designing the conductive grid using the centers of the circle lattices.

The centers of the plurality of circle lattices are distributed according to regular polygons arranged in an array. The overall shape of the conductive grid may be better controlled by arranging the centers according to regular polygons. For example, the centers of the plurality of circle lattices are distributed according to regular triangles, regular quadrangles or regular hexagons without intervals, and the circular lattices are connected in a circumscribed form or connected through a linear grid line, so that the arrangement is more compact and the electrical conductivity and interference may be better controlled.

The plurality of circle lattices may be distributed in a coordinate with an X-axis and a Y-axis, and a difference between a sheet resistance of the conductive grid distributed along the X-axis and a sheet resistance of the conductive grid distributed along the Y-axis is no more than 5%. By designing the arrangement of the circle lattices, the difference between the sheet resistances of the whole conductive grid along the X-axis and the Y-axis does not exceed 5%, so that the electrical conductivity of the conductive grid is more excellent. For example, a total length of the conductive grid distributed along the X-axis is equal to a total length of the conductive grid distributed along the Y-axis.

In order to make the dot pattern formed by interference softer and minimize the impact on vision caused by interference, there is no internal tangent, inner sleeving and overlap between the plurality of circle lattices, and the conductive grid interconnected is in the grooves without any sharp included angle.

In other embodiments, the plurality of circle lattices are overlapped and connected, and an overlapping amount at each overlapped place is the same. The impact on vision caused by interference will be very low by controlling the overlapping amount at each overlapped place to be the same.

A shape of a cross-section of each groove is a rectangle or an inverted trapezoid, and the conductive grid is embedded in the first side face through the grooves, so that an excellent conductive grid may be obtained and a better electrical conductivity may be realized.

A conductive film of the present disclosure will be described below with reference to the drawings.

Figure 2:
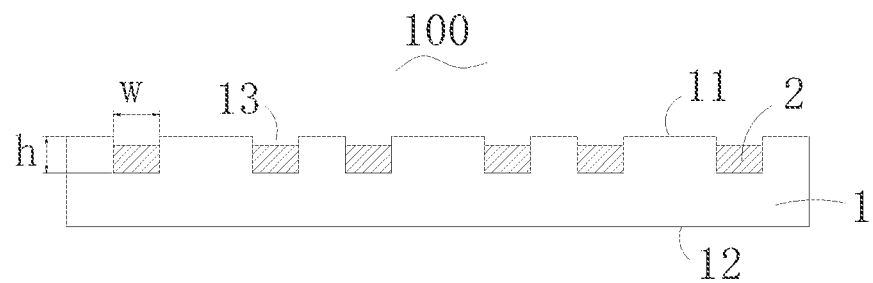
FIG. 2 is a sectional view of a conductive film according to the present disclosure.

Referring to FIGS. 1 and 2, the conductive film 100 may include a transparent supporting layer 1 and a conductive grid 2. The transparent supporting layer 1 may include a first side face 11 and a second side face 12 arranged opposite to each other. The first side face 11 is provided with grooves 13. The grooves 13 are shaped as a grid interconnected, and a conductive material is filled in the grooves 13 to form the conductive grid 2. The conductive grid 2 may include a plurality of circular lattices 21. The plurality of circular lattices 21 are the same in radius, and their centers are distributed according to a regular hexagonal honeycomb shape. Adjacent circular lattices 21 are connected in a circumscribed form, and the circular lattices 21 and the tangent portions are located in the grooves 13. There is no internal tangent, inner sleeving and overlap between the plurality of circular lattices 21.

A shape of a cross-section of each groove 13 is the same and is a rectangle, and the grooves 13 have the same depth h everywhere, where the value of h ranges from 2 µm to 8 µm. The grid lines of the circular lattices 21 have a uniform width w, where the value of w ranges from 2 µm to 10 µm. The width w of the grid lines at the tangent positions is slightly larger by 0.5 µm to 1 µm. The value of the diameter d of the circular lattices 21 ranges from 50 µm to 500 µm, for example, 100 µm to 300 µm. In other embodiments, the grid lines of the circular lattices 21 may be difference in shape or size.

The filled conductive material may be one or a combination of a metal conductive material, a compound conductive material or an organic conductive material. The metal may be, for example, silver, gold, copper, iron, nickel, aluminum or the like. The compound may be, for example, ITO. The organic conductive material may be, for example, PEDOT.

Referring to FIG. 1, if the conductive grid is placed in a coordinate with axes, the total length of the conductive grid distributed along the X-axis is equal to the total length of the conductive grid distributed along the Y-axis, and the sheet resistance of the conductive grid distributed along the X-axis is equal to the sheet resistance of the conductive grid distributed along the Y-axis. The whole conductive grid is distributed uniformly.

The conductive film 100 may be formed by coating a UV resin layer, then embossing and curing the UV resin layer to form the transparent supporting layer 1 with the grooves 13 interconnected. Then the conductive material may be filled in the grooves 13 to form the conductive grid 2. The conductive grid 2 may include a plurality of circular lattices 21. The plurality of circular lattices 21 are the same in size and distributed in a regular hexagonal honeycomb shape.

The conductive grid 2 of the conductive film 100 includes a plurality of circular lattices 21 arranged in a honeycomb shape. The dot pattern presented by the plurality of circular lattices 21 is relatively soft with slight interference, so that the impact on vision caused by interference is reduced and the vision is clearer. Since the conductive grid 2 is formed by filling the grooves 13, the shape of the conductive grid 2 is realized by the shape of the grooves 13, and the electrical conductivity is excellent.

Figure 3:
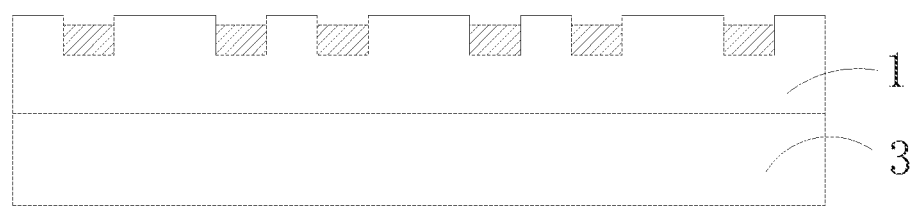
FIG. 3 is another sectional view of a conductive film according to the present disclosure.

Referring to FIG. 3, the conductive film 100 may further include a substrate layer 3, which may be a single-layer structure or a composite layer structure. For example, the substrate layer 3 may be PET, PE, PC, PMMA, glass or a composite panel. The transparent layer 1 may be adhered to the substrate layer 3 by an adhesive material, or may be directly formed on the substrate layer 3, for example, a UV resin layer is coated on the PET.

Figure 4:
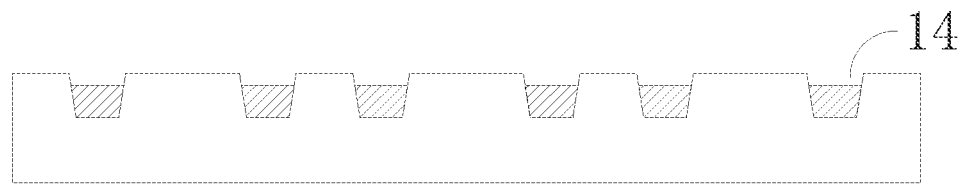
FIG. 4 is another sectional view of a conductive film according to the present disclosure.

Referring to FIG. 1, a shape of a cross-section of each groove 13 may be a rectangle. In other embodiments, the shape of the cross-section of each groove 14 may be an inverted trapezoid. Referring to FIG. 4, the arrangement of the inverted trapezoid may facilitate demolding when the mold is removed after embossing the grooves.

Figure 5:
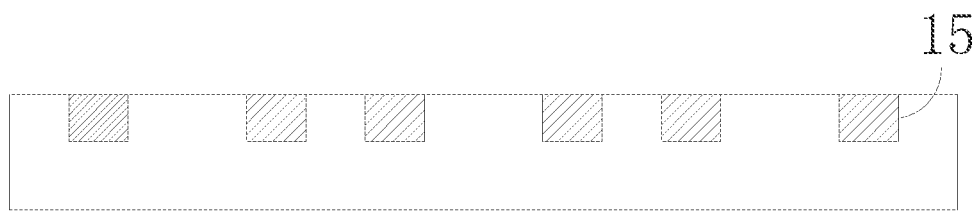
FIG. 5 is yet another sectional view of a conductive film according to the present disclosure.

The conductive material may not fill the grooves 13 completely, or may fill the grooves 13 exactly, referring to FIG. 5. Of course, in other embodiments, the conductive material may flow over the grooves. The conductive material in the grooves may be arranged in one, two or more layers.

Figure 6:
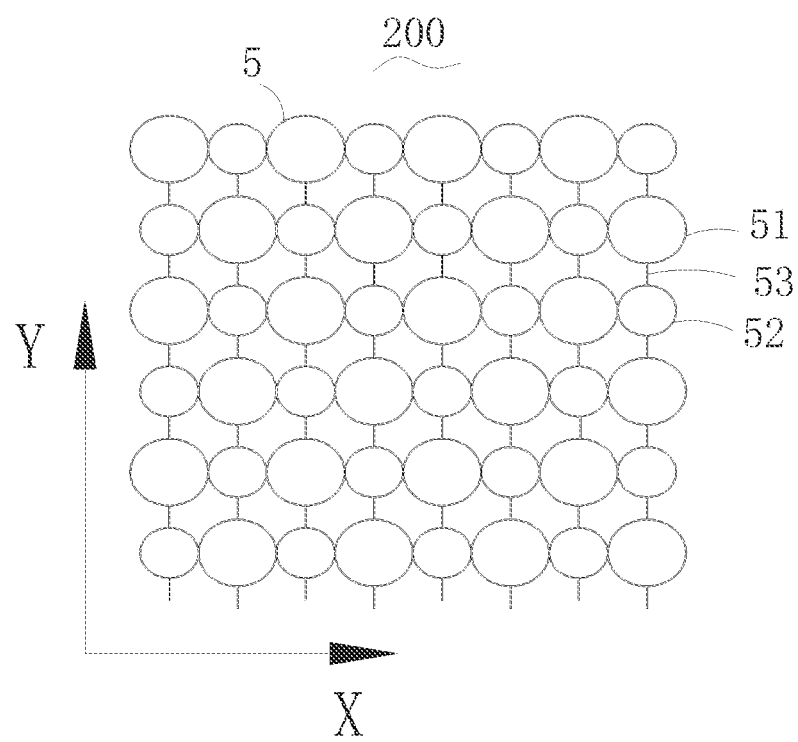
FIG. 6 is another plan view of a conductive film according to the present disclosure.

Referring to FIG. 6, the conductive grid 5 of the conductive film 200 may include a plurality of elliptic lattices 51, 52. The length of the major axes of the elliptic lattices 51 is greater than that of the elliptic lattices 52. In the same row, the elliptic lattices 51 and the elliptic lattices 52 are regularly spaced, and adjacent elliptic lattices 51 and elliptic lattices 52 are connected in a circumscribed form. The elliptic lattices 52 and the elliptic lattices 51 in adjacent row are arranged at intervals. That is, in the same column, the elliptic lattices 51 and the elliptic lattices 52 are also regularly spaced. The elliptic lattices in adjacent two rows are connected through linear grid lines 53.

In this embodiment, the elliptic lattices 51 and the elliptic lattices 52 in upper and lower rows are connected through linear grid lines 53 in the form of straight lines. In other embodiments, the linear grid lines 53 are regularly spaced. That is, one group of the elliptic lattice 51 and the elliptic lattice 52 arranged in upper and lower rows is connected through a linear grid line 53; adjacent groups of the elliptic lattices 51 and the elliptic lattices 52 are not connected; and the third group of the elliptic lattice 51 and the elliptic lattice 52 is connected through a linear grid line 53, and so on. Or, in two adjacent rows, the elliptic lattices 51 are connected to the elliptic lattices 51, and the elliptic lattices 52 are connected to e the elliptic lattices 52. Or, the elliptic lattices in two adjacent rows are connected in a random manner through linear grid lines in the form of straight lines, curves or broken lines. Thus, slight interference is caused, and clear vision is realized.

In the coordinate with X-axis and the Y-axis, the difference between the sheet resistance of the conductive grid distributed along the X-axis direction and the sheet resistance of the conductive grid distributed along the Y-axis direction does not exceed 3%, i.e., being substantially equal. Thus, the conductive grid is distributed uniformly, and the electrical conductivity is stable.

Figure 7:
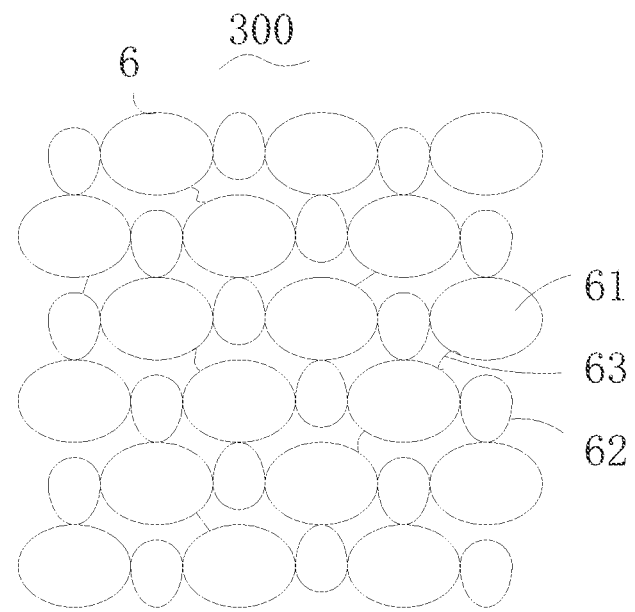
FIG. 7 is another plan view of a conductive film according to the present disclosure.

Referring to FIG. 7, the conductive grid 6 of the conductive film 300 may include elliptic lattices 61, quasi-circular lattices 62 and linear grid lines 63. Halves of the quasi-circular lattices 62 are elliptic, while the other halves thereof are circular. The elliptic lattices 61 and the quasi-circular lattices 62 are regularly spaced in an array, and the elliptic lattices 61 and the quasi-circular lattices 62 are connected in a circumscribed form or connected through the linear grid lines 63.

Figure 8:
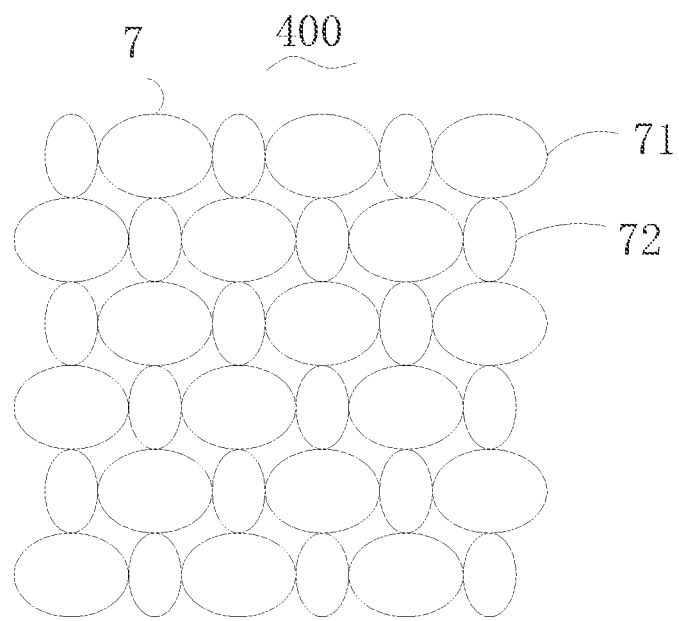
FIG. 8 is yet another plan view of a conductive film according to the present disclosure.

Referring to FIG. 8, the conductive grid 7 of the conductive film 400 may include elliptic lattices 71, 72. The elliptic lattices 71 and 72 in difference sizes are regularly spaced in an array, and the elliptic lattices 71 and 72 are connected in a circumscribed form to each other.

The conductive grid of the conductive film includes circular lattices, quasi-circular lattices or elliptic lattices, and they are connected in a circumscribed form or connected through linear grid lines. Since the circular lattices, quasi-circular lattices or elliptic lattices are connected in a circumscribed form or connected through linear grid lines, there is no internal tangent and overlap, and slight interference is caused and clear vision is realized. Moreover, the conductive grid is all arranged in the grooves, so that the electrical conductivity is stable.

In order to make the above objectives, features and advantages of the present disclosure more obvious and comprehensible, the specific implementations of the present disclosure have been described in detail above with reference to the drawings. Numerous specific details have been stated in the foregoing description in order to fully understand the present application. However, the present disclosure can be implemented in various other ways different from those described above, and those skilled in the art can make similar improvements without departing from the essence of the present disclosure, so the present disclosure is not limited by the specific implementations disclosed above. Moreover, the technical features of the above embodiments can be arbitrarily combined. For simplicity, all possible combinations of the technical features in the above embodiments are not described. However, all combinations of these technical features shall fall into the scope recorded by this specification if not conflicted.

The above embodiments merely show several implementations of the present disclosure and are described in more specific details, but they cannot be construed as limiting the patent scope of the present disclosure. It should be pointed out that, for a person of ordinary skill in the art, a number of variations and improvements can be made without departing from the concept of the present disclosure, and those variations and improvements shall fall into the protection scope of the present disclosure. Therefore, the protection scope of the present disclosure should be subject to the appended claims.

What is claimed is:

1. A conductive film, comprising:
   a transparent supporting layer, comprising a first side face and a second side face arranged opposite to each other, wherein the first side face is provided with grooves, and the grooves form a grid shape; and
   a conductive grid, wherein a conductive material is filled in the grooves to form the conductive grid interconnected; and
   the conductive grid comprises a plurality of circle lattices;
   wherein the circle lattice comprises a circular lattice, a quasi-circular lattice or an elliptic lattice; and
   wherein the conductive grid comprises a plurality of circular lattices, centers of the circular lattices are distributed according to a honeycomb grid, and the plurality of circular lattices are connected in a circumscribed form and/or connected through a linear grid line.

2. The conductive film according to claim 1, wherein the conductive grid comprises a plurality of circular lattices, and the plurality of circular lattices are connected in a circumscribed form in the grooves.

3. The conductive film according to claim 2, wherein some of the plurality of circular lattices are connected through a linear grid line.

4. The conductive film according to claim 2, wherein there is one or more diameter dimensions of the plurality of circular lattices.

5. The conductive film according to claim 1, wherein centers of the plurality of circle lattices are distributed according to a predetermined rule.

6. The conductive film according to claim 5, wherein the centers of the plurality of circle lattices are distributed according to regular polygons arranged in an array.

7. The conductive film according to claim 6, wherein the centers of the plurality of circle lattices are distributed according to regular triangles, regular quadrangles or regular hexagons without intervals.

8. The conductive film according to claim 6, wherein the plurality of circular lattices are connected in a circumscribed form or connected through a linear grid line.

9. The conductive film according to claim 1, wherein the plurality of circle lattices are distributed in a coordinate with an X-axis and a Y-axis, and a difference between a sheet resistance of the conductive grid distributed along the X-axis and a sheet resistance of the conductive grid distributed along the Y-axis is no more than 5%.

10. The conductive film according to claim 9, wherein a total length of the conductive grid distributed along the X-axis is equal to a total length of the conductive grid distributed along the Y-axis.

11. The conductive film according to claim 1, wherein there is no internal tangent, inner sleeving and overlap between the plurality of circle lattices.

12. The conductive film according to claim 1, wherein a shape of a cross-section of each groove is a rectangle or an inverted trapezoid.

13. The conductive film according to claim 1, wherein the conductive grid is embedded in the first side face through the grooves.

14. The conductive film according to claim 1, wherein the plurality of circle lattices are overlapped and connected, and an overlapping amount at each overlapped place is the same.

15. An electronic device, wherein the electronic device comprises the conductive film described in claim 1.

16. A conductive film, comprising:
   a transparent supporting layer, comprising a first side face and a second side face arranged opposite to each other, wherein the first side face is provided with grooves, and the grooves form a grid shape; and
   a conductive grid, wherein a conductive material is filled in the grooves to form the conductive grid interconnected; and
   the conductive grid comprises a plurality of circle lattices;
   wherein the conductive grid comprises a plurality of elliptic lattices arranged in an array, and the plurality of elliptic lattices are connected in a circumscribed form and/or connected through a linear grid line;
   wherein the elliptic lattices in a same row are regularly spaced according to major axis sizes of the elliptic lattices, the elliptic lattices in the same row are connected in a circumscribed form, and the elliptic lattices in adjacent rows are connected through a linear grid line.

* * * * *